United States Patent
Liou et al.

(10) Patent No.: US 9,882,054 B2
(45) Date of Patent: Jan. 30, 2018

(54) FINFET WITH MERGED, EPITAXIAL SOURCE/DRAIN REGIONS

(71) Applicant: UNITED MICROELECTRONICS CORP., Hsin-Chu (TW)

(72) Inventors: En-Chiuan Liou, Tainan (TW); Yu-Cheng Tung, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/981,869

(22) Filed: Dec. 28, 2015

(65) Prior Publication Data

US 2017/0141221 A1  May 18, 2017

(30) Foreign Application Priority Data

Nov. 12, 2015 (TW) .............. 104137271 A (51) Int. Cl.

| | |
|---|---|
| H01L 29/78 | (2006.01) |
| H01L 29/08 | (2006.01) |
| H01L 29/06 | (2006.01) |
| H01L 29/16 | (2006.01) |
| H01L 29/161 | (2006.01) |
| H01L 29/165 | (2006.01) |
| H01L 21/306 | (2006.01) |
| H01L 29/66 | (2006.01) |
| H01L 21/768 | (2006.01) |
| H01L 21/02 | (2006.01) |

(52) U.S. Cl.
CPC ...... *H01L 29/785* (2013.01); *H01L 21/30604* (2013.01); *H01L 21/76897* (2013.01); *H01L 29/0649* (2013.01); *H01L 29/0657* (2013.01); *H01L 29/161* (2013.01); *H01L 29/165* (2013.01); *H01L 29/66636* (2013.01); *H01L 29/66795* (2013.01)

(58) Field of Classification Search
CPC ............ H01L 29/66795; H01L 29/785; H01L 21/823431; H01L 27/0886; H01L 21/845; H01L 27/1211; H01L 21/823821; H01L 21/823814; H01L 29/7848; H01L 27/0924; H01L 21/823418

See application file for complete search history.

(56) References Cited

U.S. PATENT DOCUMENTS

| | | |
|---|---|---|
| 8,043,920 B2 | 10/2011 | Chan |
| 8,426,923 B2 | 4/2013 | Lee |
| 8,440,517 B2 | 5/2013 | Lin |

(Continued)

*Primary Examiner* — Victor A Mandala
*Assistant Examiner* — Regan J Rundio
(74) *Attorney, Agent, or Firm* — Winston Hsu (57) ABSTRACT

A FinFET is provided. The FinFET includes a substrate. A plurality of fin structures are defined on the substrate. A gate structure crosses each fin structure. Two first recesses are disposed on two sides of the gate structure respectively, wherein each first recess further includes a plurality of second recesses disposed therein, and the position of each second recess corresponds to each fin structure. Two epitaxial layers are disposed at two sides of the gate structure respectively and in the first recesses, each epitaxial layer has a bottom surface including a second concave and convex profile, and each epitaxial layer directly contacts a bottom surface of each first recess and a bottom surface of each second recess.

11 Claims, 7 Drawing Sheets

(56) References Cited

U.S. PATENT DOCUMENTS

| | | | |
|---|---|---|---|
| 8,723,272 B2* | 5/2014 | Liu | H01L 29/66795 |
| | | | 257/401 |
| 9,190,417 B2 | 11/2015 | Chang | |
| 9,287,382 B1* | 3/2016 | Lee | H01L 21/845 |
| 9,337,193 B2* | 5/2016 | Liao | H01L 29/41791 |
| 9,391,201 B2* | 7/2016 | Huang | H01L 29/7848 |
| 9,570,556 B1* | 2/2017 | Lee | H01L 29/0847 |
| 2012/0049294 A1* | 3/2012 | Chen | H01L 21/82343 |
| | | | 257/401 |
| 2012/0091538 A1* | 4/2012 | Lin | H01L 29/66795 |
| | | | 257/401 |
| 2013/0277720 A1 | 10/2013 | Kim | |
| 2013/0277759 A1 | 10/2013 | Chen | |
| 2014/0197457 A1* | 7/2014 | Wang | H01L 29/785 |
| | | | 257/192 |
| 2015/0145065 A1 | 5/2015 | Kanakasabapathy | |
| 2016/0380081 A1* | 12/2016 | Hsu | H01L 29/66795 |
| | | | 257/401 |
| 2017/0076973 A1* | 3/2017 | Lee | H01L 21/764 |
| 2017/0077222 A1* | 3/2017 | Lee | H01L 21/283 |
| 2017/0077228 A1* | 3/2017 | Lee | H01L 29/0847 |
| 2017/0077229 A1* | 3/2017 | Hsu | H01L 29/0847 |

* cited by examiner

FINFET WITH MERGED, EPITAXIAL SOURCE/DRAIN REGIONS

BACKGROUND OF THE INVENTION

1. Field of the Invention

The present invention relates to a FinFET (fin-shaped field-effect transistor), and more particularly to a FinFET having an epitaxial layer comprising a recessed and protruding profile, and a method of making the same.

2. Description of the Prior Art

In the rapidly advancing semiconductor manufacturing industry, FinFET devices are increasingly used in many applications and are integrated into various different types of semiconductor devices. The use of fins increases the surface areas of the channel and source/drain regions. This increased surface area results in faster, more reliable and better-controlled semiconductor transistor devices that consume less power.

As the size of the FinFET becomes smaller, however, the epitaxial layer serving as the source/drain region also shrinks. Therefore, the contact area between the contact plug and the epitaxial layer becomes smaller, which increases the sheet resistance of the contact plug.

SUMMARY OF THE INVENTION

The present invention provides a method of fabricating a FinFET, comprising the following steps: first, a substrate having a plurality of fin structures disposed thereon is provided, an STI disposed between adjacent fin structures and a gate structure crossing the fin structures. Next, the fin structures not covered by the gate structure and the STI not covered by the gate structure are etched, until the STI is removed entirely and a first recessed and protruding profile is formed on the substrate, wherein the first recessed and protruding profile includes a first recess and a plurality of second recesses, and the position of the second recesses corresponds to the position of the fin structures, and an epitaxial layer is formed on the first recessed and protruding profile.

The present invention further provides a FinFET, comprising: a substrate having a plurality of fin structures defined thereon; a gate structure crossing the fin structures, two first recesses, disposed at two sides of the gate structure, and a plurality of second recesses is disposed within the first recess, the position of the second recesses corresponds to the position of the fin structures, and two epitaxial layers disposed at two side of the gate structure, and disposed within the first recesses and the second recesses respectively, wherein a bottom of each epitaxial layer comprises a second recessed and protruding profile, and each epitaxial layer contacts a bottom of the first recess and a bottom of each second recess directly.

A key feature of the present invention is to provide a FinFET with a specific shape epitaxial layer. In the conventional FinFET, each fin has its own epitaxial layers disposed at two sides of the gate structure, and the epitaxial layer on one fin structure does not contact the epitaxial layers on the other fin structure, so there are numerous epitaxial layers at the same side of the gate structure. The epitaxial layers at the same side of the gate structure are connected to the same circuit. In the present invention, however, all fin structures share one bulk epitaxial layer at the same side of the gate structure. The bulk epitaxial layer will have smaller resistance compared to the conventional epitaxial layers.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 9 depict a method of fabricating a FinFET according to a preferred embodiment of present invention, wherein

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
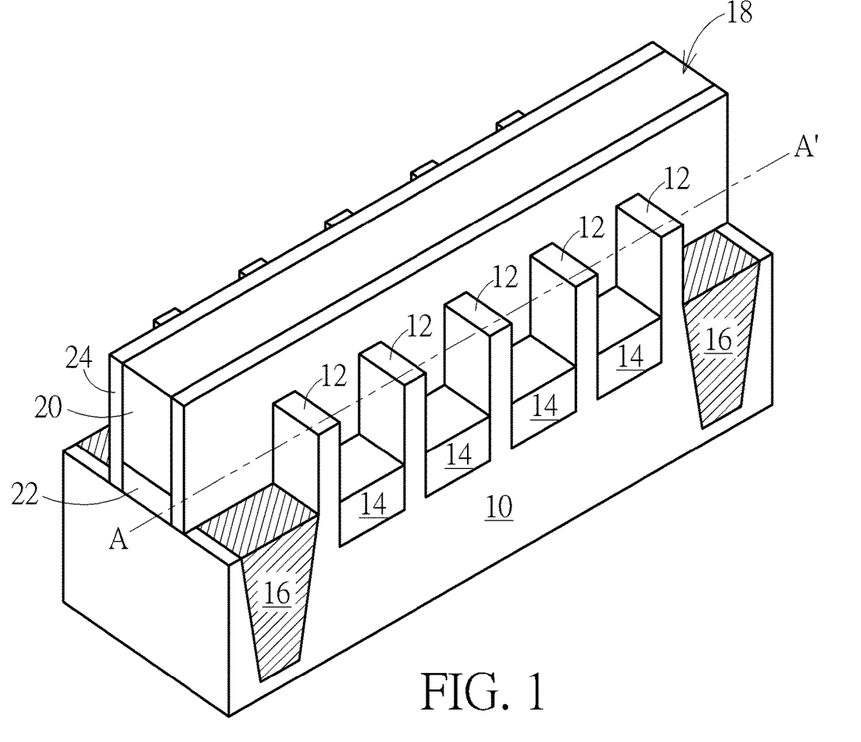
Figure 2:
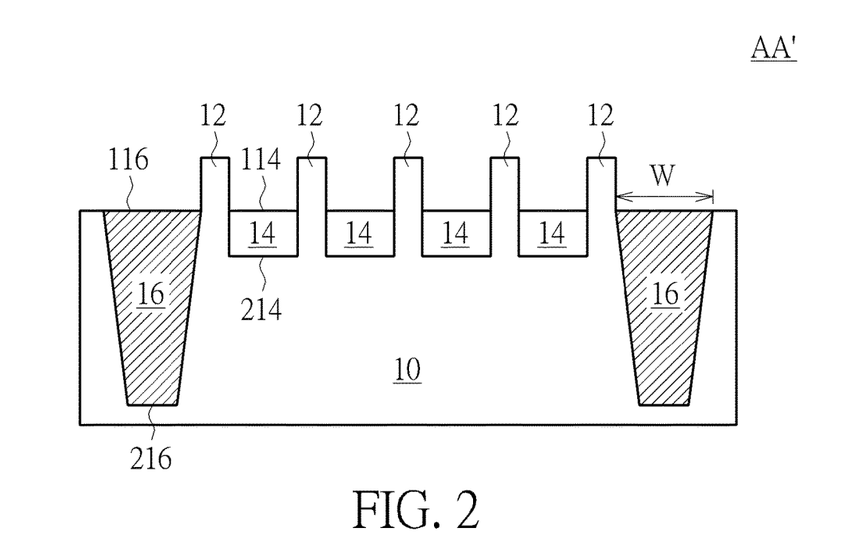
FIG. 2 is a sectional view taken along line AA' in FIG. 1.
Figure 3:
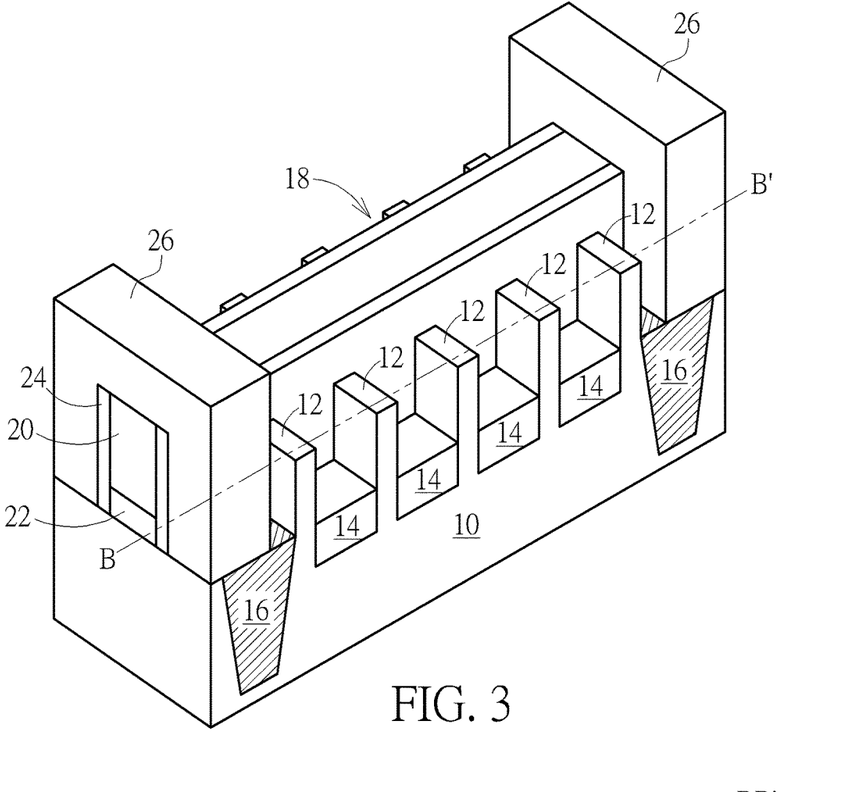
Figure 4:
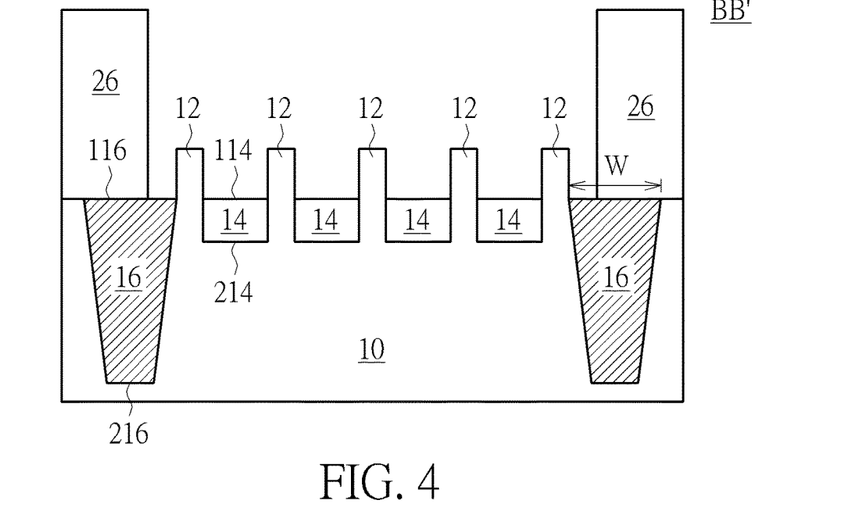
FIG. 4 is a sectional view taken along line BB' in FIG. 3.
Figure 5:
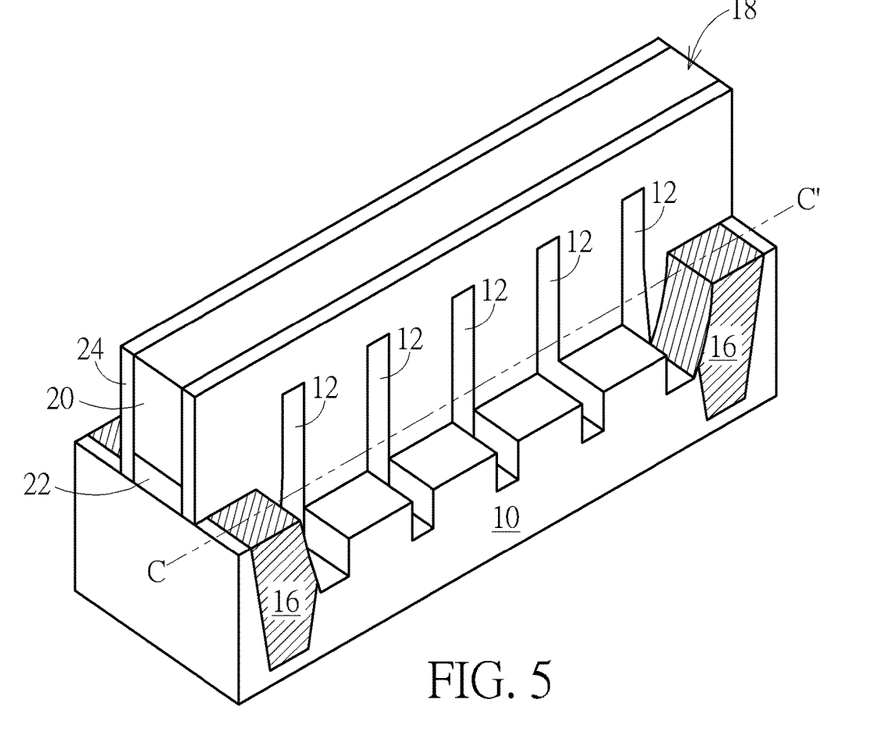
Figure 6:
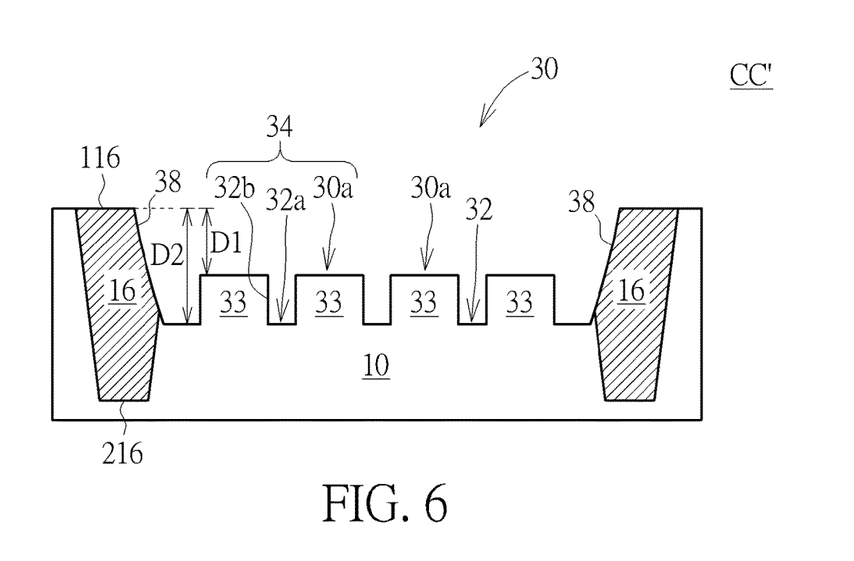
FIG. 6 is a sectional view taken along line CC' in FIG.
Figure 7:
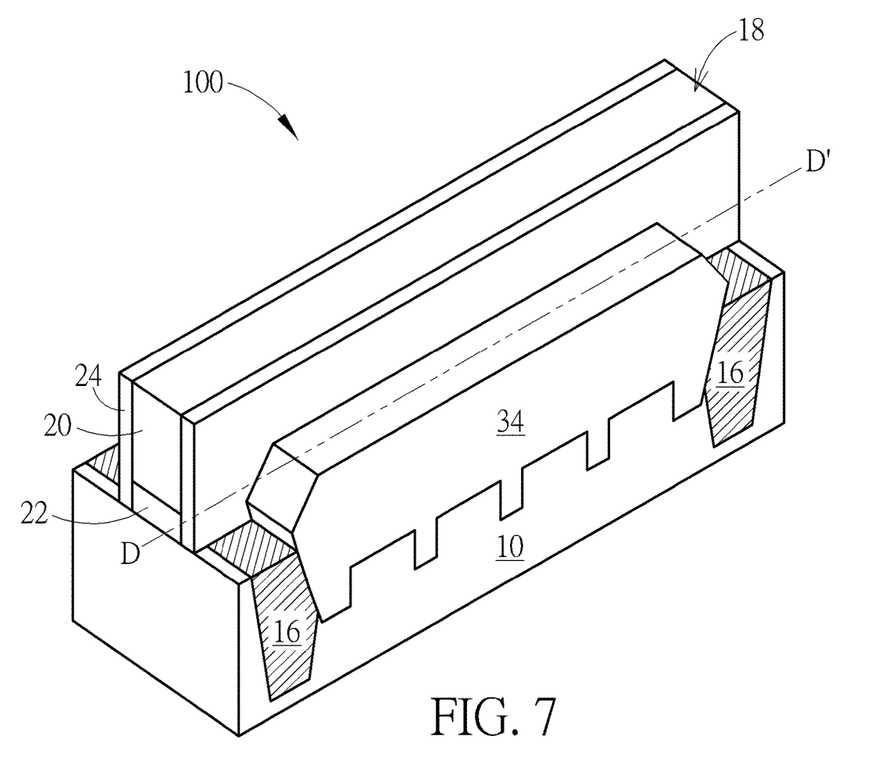
Figure 8:
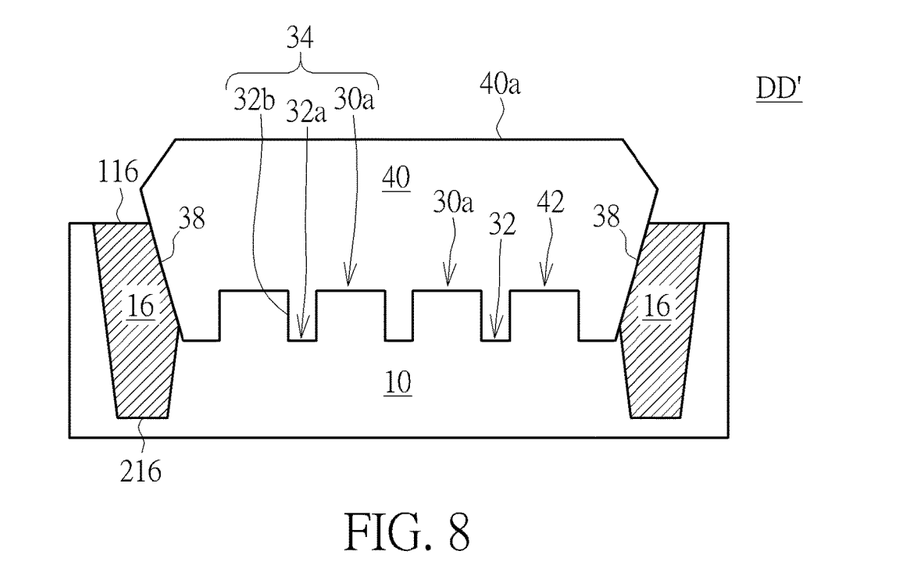
FIG. 8 is a sectional view taken along line DD' in FIG. 7.

FIG. 1 to FIG. 9 depict a method of fabricating a FinFET according to a preferred embodiment of present invention, wherein FIG. 2 is a sectional view taken along line AA' in FIG. 1, FIG. 4 is a sectional view taken along line BB' in FIG. 3, FIG. 6 is a sectional view taken along line CC' in FIG, FIG. 8 is a sectional view taken along line DD' in FIG. 7.

As shown in FIG. 1 and FIG. 2, a substrate 10 is provided. The substrate 10 has numerous fin structures 12 defined thereon. In other words, the fin structures 12 are formed by removing part of the substrate 10, so that the fin structure becomes part of the substrate 10. The number of the fin structures is not limited. In addition, the fin structures 12 are parallel to one another. A shallow trench isolation (STI) 14 is disposed between two adjacent fin structures 12. The STI 14 is on the substrate 10. A deep trench isolation (DTI) 16 is disposed within the substrate, wherein the DTI 16 is disposed at a side of the fin structure 12 which is the first or the last among all of the fin structures 12. Atop surface 116 of the DTI 16 is aligned with a top surface 114 of the STI 14. A bottom 216 of the DTI 16 is deeper than a bottom 214 of the STI 14. Moreover, a gate structure 18 crosses each fin structure 12, the DTI 16 and the STI 14. The gate structure 18 may include a gate electrode 20 and a gate dielectric layer 22. The gate structure 18 can optionally comprise a spacer 24. The gate dielectric layer 22 contacts the fin structures 12, the DTI 16 and the STI 14. The gate electrode 20 is disposed on the gate dielectric layer 22, and the spacer 24 is disposed at two sides of the gate electrode 20.

The material of the gate dielectric layer 22 may include silicon oxide (SiO), silicon nitride (SiN), silicon oxynitride (SiON), or a high-k dielectric material having a dielectric constant (k value) larger than 4 such as metallic oxide, such as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta2O_9$, SBT), lead zirconate titanate ($PbZrxTi_{1-x}O_3$, PZT), barium strontium titanate ($BaxSr_{1-x}TiO_3$, BST) or a combination thereof. The material of the gate electrode 20 may include undoped polysilicon, heavily doped polysilicon, or one or a plurality of metal layers such as a work function metal layer, a barrier layer and a low-resistance metal layer, etc. But the present invention is not limited thereto, and the materials can be adjusted according actual requirements.

As shown in FIG. 3 and FIG. 4, a mask layer 26 is formed to cover the gate structure 18, and at least part of the DTI 16. The fin structures 12 at two sides of the gate structure 18, the STI 14 and part of the DTI 16 are exposed through an opening of the mask layer 26. As shown in FIG. 4, the DTI 16 includes a surface width W. At least one quarter of the surface width W to one half of the surface width W should be exposed through the opening of the mask layer 26.

Figure 6B:
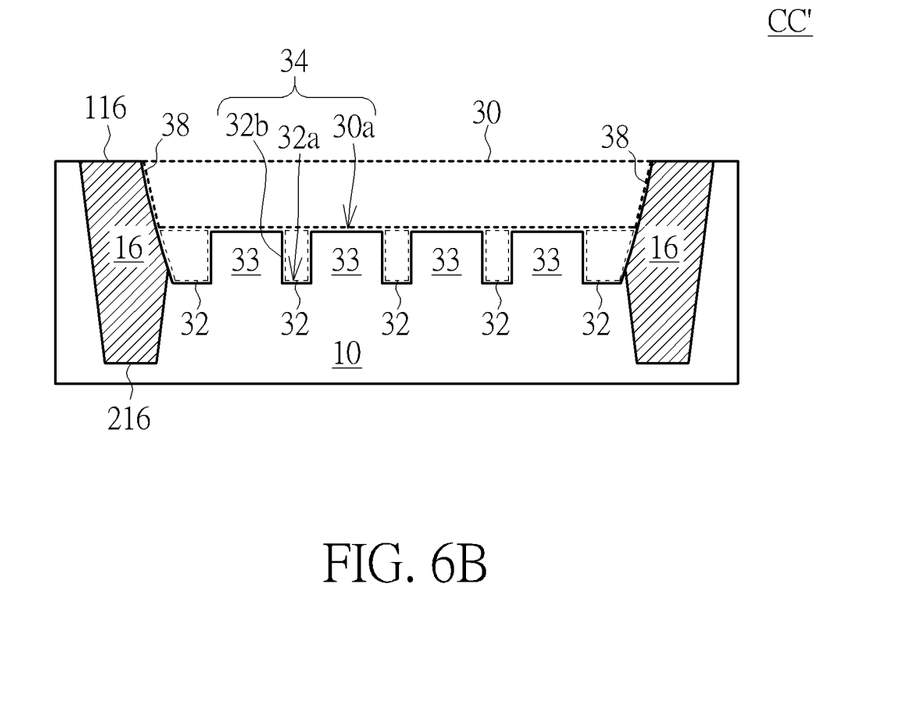
FIG. 6B is the schematic diagram showing the region of the first region and the regions of each second recess in different dot lines.

As shown in FIG. 5 and FIG. 6, the exposed fin structures 12, the exposed STI 14 and the exposed DTI 16 are removed to form at least two first recesses 30 at two sides of the gate structure 18, and a plurality of second recesses 32 are formed in each first recess 30, wherein the second recesses 32 are arranged in parallel to each other. In other words, when viewed in the cross section view (FIG.6), a plurality of protruding parts 33 are disposed in each first recess 30, and the second recess 32 is disposed between every two adjacent protruding parts 33. Therefore, a first recessed and protruding profile 34 is formed, the first recessed and protruding profile 34 consists of a bottom 30a of the first recess 30, the bottom 32a of each second recess 32 and the sidewalls 32b of each second recess 32. The first recessed and protruding profile 34 is teeth-like. In addition, the bottom 32a of each second recess 32 is lower than the bottom 30a of the first recess 30. Besides, FIG 6B further shows the region of the first recess 30 and the region of each second recess 32 in different dot lines.

In detail, the fin structures 12, the exposed STI 14 and the exposed DTI 16 can be removed by an etching process. For example, initially, a first etching condition which has a high etching ratio of silicon in comparison with the silicon oxide is applied (in other words, the etching rate for etching the silicon is much higher than the etching rate for etching the silicon oxide). Because the STI 14 is made of silicon oxide and the fin structures 12 is made of a silicon substrate, the fin structures 12 are etched while the STI 14 is hardly etched during the first etching condition. Then, for example, a second etching condition which has an etching ratio of silicon to silicon oxide of 2:1 is applied (the etching rate for etching the silicon: the etching rate for etching the silicon oxide is 2:1) , but not limited thereto. The fin structure 12 and the STI 14 are etched simultaneously until the STI 14 is removed entirely. In other words, the STI 14 at two sides of the gate structure 18 and not covered by the gate structure 18 is entirely etched. Furthermore, the fin structures 12 at two sides of the gate structure 18 and not covered by the gate structure 18 are also etched while etching the STI 14. Since the etching rate for etching the fin structure 12 is higher than the etching rate for etching the STI 14, after the etching process is performed, not only is the fin structure 12 removed entirely, but the bottom of the first recess 30 is also be etched, and a plurality of second recesses 32 are formed in the first recess 30. In addition, the position of each second recess 32 corresponds to the position of each fin structure 12 before the etching process is performed. Therefore, the first recessed and protruding profile 34 consists of the first recess 30 and a plurality of second recesses 32. The bottoms 30a of the first recess 30 that are between every two adjacent second recesses 32 are defined as the protruding portions of the first recessed and protruding profile 34, and those bottoms 32a of the second recesses 32 are defined as the recessed portions of the first recessed and protruding profile 34.

Besides, when etching the exposed STI 14 and the exposed fin structures 12, part of the DTI 16 is removed as well. Therefore, a recess 38 is formed on the remaining DTI 16. The recess 38 is adjacent to one of the second recess 32, and the recess 38 forms a continuous profile with the sidewall 32b of the second recess 32.

It is noteworthy that since the position of each second recess 32 corresponds to the position of each fin structure 12 before the fin structure 12 is removed, after the second recesses 32 are formed, the sidewalls of the fin structures 12 that are covered under the gate structure 18 are exposed by the second recesses 32.Besides, the etching process mentioned above is preferably a dry etching process. In one embodiment of the present invention, the depth D1 of the first recess 30 is preferably between 100 and 400 angstroms, the depth D2 of each second recess 32 is preferably between 300 and 600 angstroms, but not limited thereto, and it can be adjusted according to actual requirements. Furthermore, after the second recesses are formed, an ion implantation process (not shown) can be performed on the substrate 10 disposed under the first recess 30 and the second recess 32. Preferably, the ions that are implanted into the substrate 10 have the different conductivity type from the conductivity type of the following-formed epitaxial layer (which can be used as the source/drain region of the transistor). In this way, the leakage current issue can be further prevented.

As shown in FIG. 7 and FIG. 8, an epitaxial layer 40 is formed on the first recessed and protruding profile 34. The epitaxial layer 40 contacts the substrate 10 directly. More precisely, the epitaxial layer 40 at least contacts the bottom 30a of the first recess 30 and the bottoms 30a of the second recesses 32. Preferably, the epitaxial layer 40 has a flat top surface 40a, contacts the first recessed and protruding profile 34 and the DTIs 16. In addition, a bottom 40b of the epitaxial layer 40 includes a second recessed and protruding profile 42. The second recessed and protruding profile 42 is complementary to the first recessed and protruding profile 34 to make the second recessed and protruding profile 42 engage into the first recessed and protruding profile 34.

Figure 9:
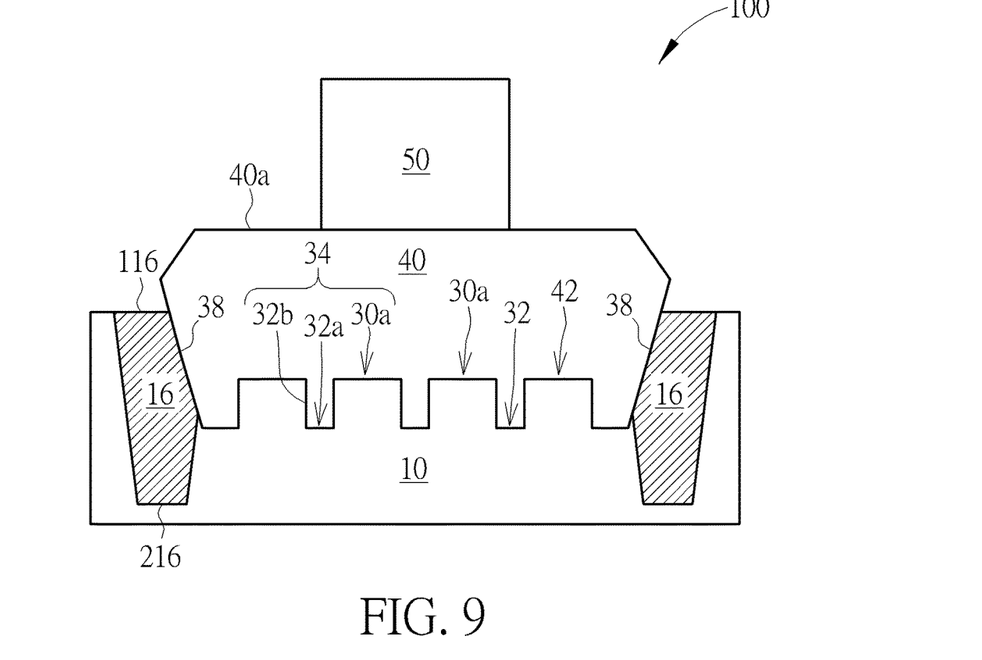

As shown in FIG. 9, a contact plug 50 can be formed, disposed on at least one of the epitaxial layers 40 to contact the flat top surface 40a and electrically connected to the epitaxial layers 40. In addition, before the contact plug 50 is formed, a silicide layer (not shown) can be formed on the flat top surface 40a of the epitaxial layer 40. Until this step, the main structure of the FinFET 100 of the present invention is completed.

The following description will detail the different embodiments of the finFET and the manufacturing method of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 10:
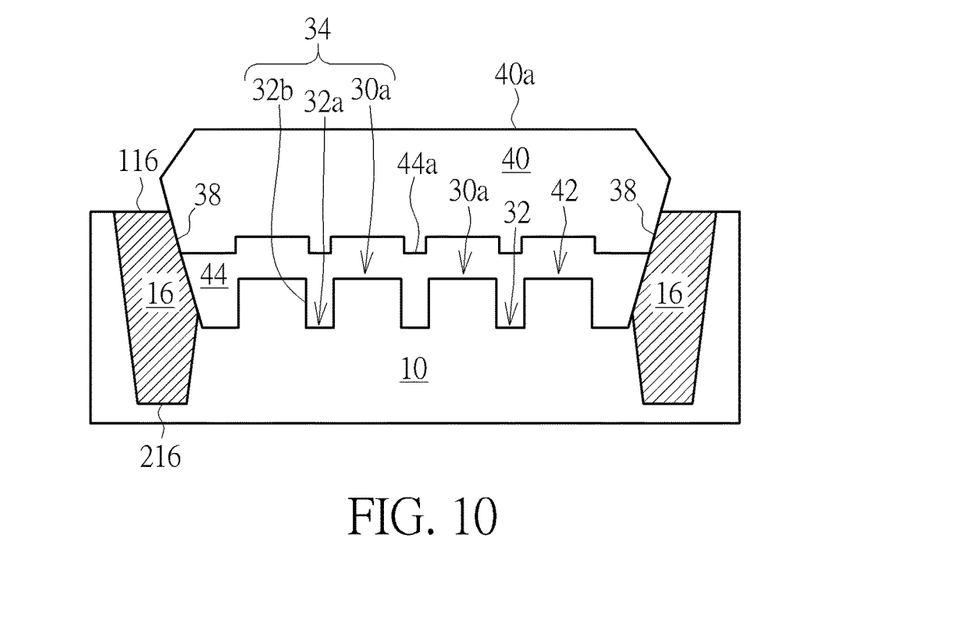
FIG. 10 shows a cross section diagram of a finFET according to another embodiment of the present invention.
Figure 11:
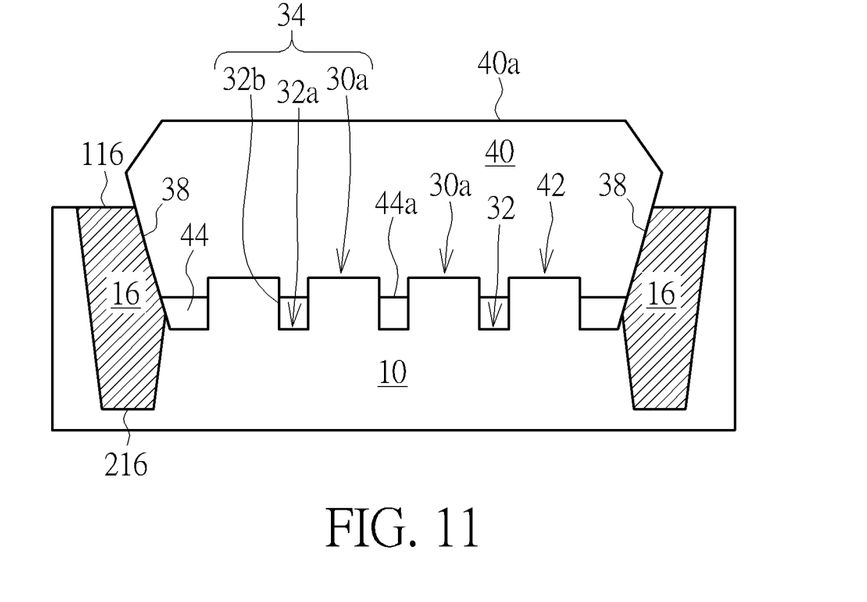
FIG. 11 shows a cross section diagram of a finFET according to another embodiment of the present invention.
Figure 12:
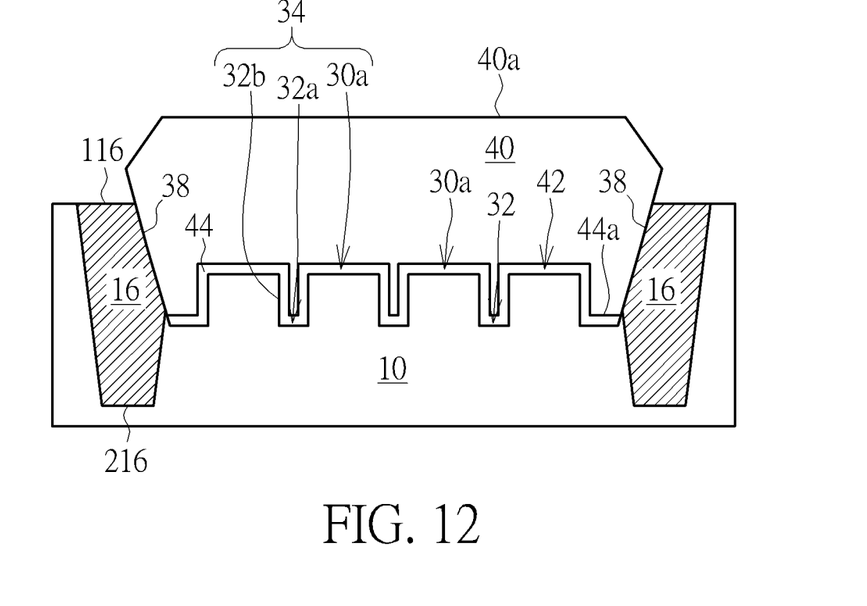
FIG. 12 shows a cross section diagram of a finFET according to another embodiment of the present invention.

Please refer to FIG. 10, which shows a cross section diagram of a finFET according to another embodiment of the present invention. The difference between this embodiment and the first preferred embodiment mentioned above is further filling an epitaxial layer 44 in the first recess 30 and the second recesses 32, the epitaxial layer 44 is filled into each second recess 32 conformally, and the epitaxial layer 44 has a bottom 44a in each second recess 32, the bottom 44a being preferably higher than the bottom 30a of the first recess 30. Afterwards, the epitaxial layer 40 mentioned above is formed on the epitaxial layer 44. The epitaxial layer 40 and the epitaxial layer 44 may include a same material or different materials. For example, the epitaxial layer 44 may comprises a silicon germanium (SiGe) layer with lower germanium containing ratio (the germanium containing ratio is about 10%-25%), and the epitaxial layer 40 may comprises a silicon germanium (SiGe) layer with higher germanium containing ratio (the germanium containing ratio is about 35%-55%), but not limited thereto. In another embodiment of the present invention, please refer to FIG. 11, the epitaxial layer 44 does not fill up each second recess 32, but only partially fills in each second recess 32, so the top surface of the epitaxial layer 44 is lower than the bottom 30a of the first recess 30. In this case, since the epitaxial layer 40 covers the epitaxial layer 44, the epitaxial layer 40 also covers the bottom 30a of the first recess 30. In another case, please refer to FIG. 12, the epitaxial layer 44 covers the first recess 30 and the second recesses 32 conformally, and the bottom 44a of the epitaxial layer 44 is preferably lower than the bottom 30a of the first recess 30. Those structures mentioned above should also be within the scope of the present invention.

In summary, the key feature of the present invention is to provide a FinFET with a specific shape epitaxial layer. In the conventional FinFET, each fin has its own epitaxial layers disposed at two sides of the gate structure, and the epitaxial layer on one fin structure does not contact the epitaxial layers on the other fin structure, so there are numerous epitaxial layers at the same side of the gate structure. The epitaxial layers at the same side of the gate structure are connected to the same circuit. In the present invention, however, all fin structures share one bulk epitaxial layer at the same side of the gate structure. The bulk epitaxial layer will have smaller resistance compared to the conventional epitaxial layers.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A FinFET, comprising:
a substrate having a plurality of fin structures defined thereon;
a gate structure crossing the fin structures;
a first recess, disposed at one side of the gate structure;
a plurality of second recesses, disposed under the first recess and in the substrate, respectively;
a plurality of protruding parts, disposed under the first recess, respectively, wherein each protruding part is disposed between two adjacent second recesses, and the protruding parts are integral with the substrate, in addition, there is no insulating layer disposed in the first recess; and
a composite epitaxial layer disposed within the first recess and the second recesses, wherein the composite epitaxial layer comprises a first epitaxial layer and a second epitaxial layer, the first epitaxial layer is disposed under the second epitaxial layer, and a top surface of the first epitaxial layer is lower than a top surface of each protruding part.

2. The FinFET of claim 1, further comprising two DTIs disposed within the substrate, wherein the DTIs are respectively disposed at two ends of the composite epitaxial layer, and the composite epitaxial layer contacts the DTI.

3. The FinFET of claim 1, wherein a bottom of each second recess is lower than a top surface of each protruding part.

4. The FinFET of claim 1, wherein the composite epitaxial layer contacts a bottom of the first recess directly.

5. The FinFET of claim 1, wherein the substrate comprises a first recessed and protruding profile, a bottom of the composite epitaxial layer comprises a second recessed and protruding profile, the second recessed and protruding profile is complementary to the first recessed and protruding profile to make the second recessed and protruding profile engage with the first recessed and protruding profile.

6. The FinFET of claim 1, wherein the second recesses are parallel to one another.

7. The FinFET of claim 1, wherein the composite epitaxial layer comprises a flat top surface.

8. The FinFET of claim 1, wherein the first epitaxial layer is at least disposed within each second recess.

9. The FinFET of claim 8, wherein the second epitaxial layer covers the protruding parts directly.

10. The FinFET of claim 8, wherein the first epitaxial layer and the second epitaxial layer comprise different materials.

11. The FinFET of claim 1, wherein each second recess and-the plurality of the fin structures are parallel to each other.

* * * * *